United States Patent
Vujkovic-Cvijin

(10) Patent No.: US 6,724,789 B2
(45) Date of Patent: Apr. 20, 2004

(54) DENSE WAVELENGTH DIVISION MULTIPLEXING (DWDM) FIBEROPTIC SOURCE

(75) Inventor: Pajo Vujkovic-Cvijin, Mountain View, CA (US)

(73) Assignee: SRI International, Menlo Park, CA (US)

(*) Notice: Subject to any disclaimer, the term of this patent is extended or adjusted under 35 U.S.C. 154(b) by 0 days.

(21) Appl. No.: 10/020,580

(22) Filed: Dec. 13, 2001

(65) Prior Publication Data

US 2003/0020981 A1 Jan. 30, 2003

Related U.S. Application Data

(60) Provisional application No. 60/256,111, filed on Dec. 14, 2000.

(51) Int. Cl.[7] ................ H01S 3/13; H01S 3/10
(52) U.S. Cl. ........................... 372/32; 372/20
(58) Field of Search ................ 372/20, 28–29, 372/32

(56) References Cited

U.S. PATENT DOCUMENTS

| | | |
|---|---|---|
| 4,398,293 A | 8/1983 | Hall et al. |
| 4,591,372 A | 5/1986 | Bricheno et al. |
| 4,707,061 A | 11/1987 | McMahon |
| 4,813,756 A | 3/1989 | Frenkel et al. |
| 4,829,533 A | 5/1989 | Hallberg et al. |
| 4,896,327 A | 1/1990 | Ebberg |
| 4,926,429 A | 5/1990 | Chung |
| 5,025,448 A | 6/1991 | Sudo et al. |
| 5,329,539 A * | 7/1994 | Pearson et al. ........... 372/36 |
| 5,347,525 A | 9/1994 | Faris et al. |
| RE35,366 E | 10/1996 | Hall |
| 5,646,762 A | 7/1997 | Delavaux et al. |
| 5,673,129 A | 9/1997 | Mizrahi |
| 5,780,843 A | 7/1998 | Cliché et al. |
| 5,798,859 A | 8/1998 | Colbourne et al. |
| 5,892,582 A | 4/1999 | Bao et al. |
| 5,949,580 A | 9/1999 | Chiappetta et al. |
| 5,953,139 A | 9/1999 | Nemecek et al. |
| 5,966,229 A | 10/1999 | Dodley et al. |
| 6,009,111 A | 12/1999 | Corwin et al. |
| 6,014,237 A | 1/2000 | Abeles et al. |
| 6,028,881 A | 2/2000 | Ackerman et al. |
| 6,044,189 A | 3/2000 | Miller |
| 6,061,158 A * | 5/2000 | DeLong ................ 359/133 |
| 6,111,681 A | 8/2000 | Mizrahi et al. |

(List continued on next page.)

OTHER PUBLICATIONS

Bertinetto, F. et al., "Stabilization of the Emission Frequency of 1.54 μm DFB Laser Diodes to Hydrogen Iodide," *IEEE Photonics Technology Letters*, vol. 4, No. 4, pp. 472–474, Apr. 1993.

(List continued on next page.)

*Primary Examiner*—Paul Ip
*Assistant Examiner*—Phillip Nguyen
(74) *Attorney, Agent, or Firm*—Townsend and Townsend and Crew LLP

(57) ABSTRACT

An optical light source for use in wavelength division multiplexed and dense wavelength division multiplexed systems may include a reference gas contained by a hermetically sealed enclosure which also protects a plurality of light generating structures. A frequency grid generator, typically in the form of an optical etalon, can be frequency referenced to an absolute reference point provided by the reference gas. An electronic feedback control system acts upon injection current to keep the laser frequency coincident with that of the referencing structure. An active, feedback based, thermal management systems provides control of the laser frequency ranges and etalon operating point. Electronic control over a number of separate lasers (and the grid) may be effected using a multiplexed digital controller.

17 Claims, 13 Drawing Sheets

U.S. PATENT DOCUMENTS

| | | | |
|---|---|---|---|
| 6,151,340 | A | 11/2000 | Rivers |
| 6,163,072 | A * | 12/2000 | Tatoh ........................ 257/704 |
| 6,163,555 | A | 12/2000 | Siddiqui et al. |
| 6,204,920 | B1 * | 3/2001 | Ellerbrock et al. ......... 356/477 |
| 6,222,861 | B1 | 4/2001 | Kuo et al. |
| 6,226,424 | B1 | 5/2001 | Ball et al. |
| 6,271,944 | B1 | 8/2001 | Schemmann et al. |
| 6,272,157 | B1 | 8/2001 | Broutin et al. |
| 6,321,011 | B2 * | 11/2001 | Deacon ........................ 385/50 |
| 6,324,204 | B1 * | 11/2001 | Deacon ........................ 372/96 |
| 6,330,388 | B1 * | 12/2001 | Bendett et al. ............. 385/132 |
| 6,388,782 | B1 * | 5/2002 | Stephens et al. ............ 359/124 |
| 6,449,295 | B1 * | 9/2002 | Ostromek .................... 372/25 |
| 2002/0126345 | A1 * | 9/2002 | Green et al. ................ 359/122 |

OTHER PUBLICATIONS

Dimmick, Timothy E. and Weidner, Janelle, "Simple, Inexpensive Wavemeter Implemented With a Fused Fiber Coupler," *Applied Optics*, vol. 36, No. 9, pp. 1898–1901, Mar. 20, 1997.

Glance, B.S. et al., "Densely Spaced FDM Coherent Star Network With Optical Signals Confined to Equally Spaced Frequencies," *J. Lightwave Technology*, vol. 6, No. 11, pp. 1770–1781, Nov. 1988.

Lampropoulos, George A. and Lessard, Roger A. (Eds.), *Applications of Photonic Technology 2*, Plenum Press, New York, Fully–Packaged, Self–Calibrated, Absolute Optical Frequency Controller Based On A Surface–Emitting Nonlinear Semiconductor Waveguide: Applications To Multifrequency Optical Communication System, pp. 477–482, 1997.

Mizuochi, Takashi, et al., "Frequency Stabilized 622–Mb/s 16–Channel Optical FDM System and Its Performance In 1.3/1.55 $\mu$m Zero–Disperson Fiber Transmission," *J. Lightwave Technology*, vol. 13, No. 10, pp. 1937–1947, Oct. 1995.

Saitoh, T. et al., "Proposal of a Multiplex Optical Frequency Comb Generation System," *Photonics Technology Letters*, vol. 8, No. 2, pp. 287–289, Feb. 1996.

Sudo, Shoichi, et al., "Frequency–Stablized DFB Laser Module Using 1,53159 $\mu$m Absorption Line of $C_2H_2$," *IEEE Photonics Technology Letters*, vol. 1, No. 10, pp. 281–284, Oct. 1989.

Tetu, Michel, et al., "Multiwavelength Sources Using Laser Diodes Frequency–Locked to Atomic Resonances," *J. Lightwave Technology*, vol. 7, No. 10, pp. 1540–1548, Oct. 1989.

* cited by examiner

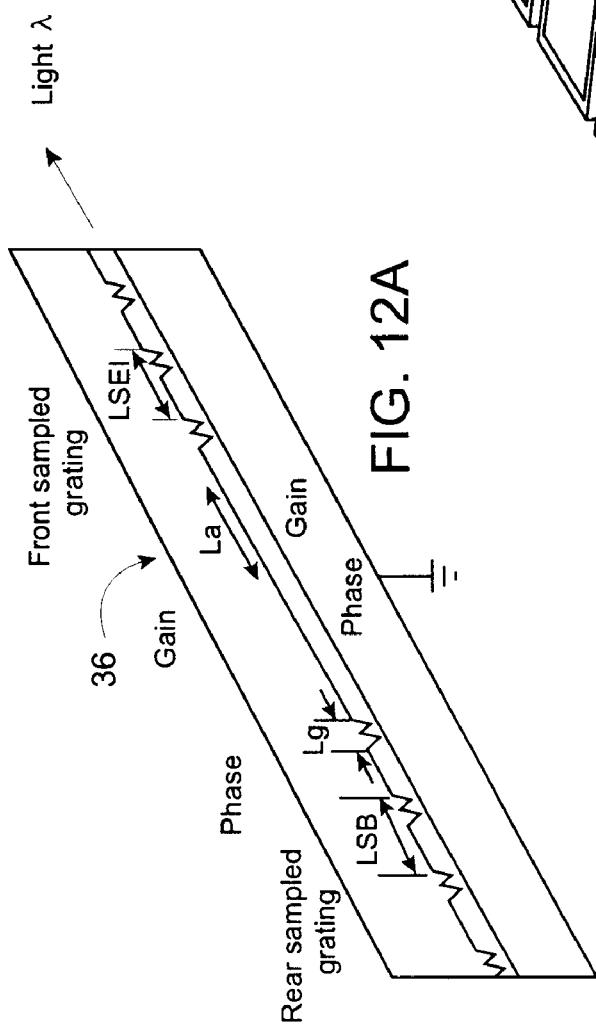
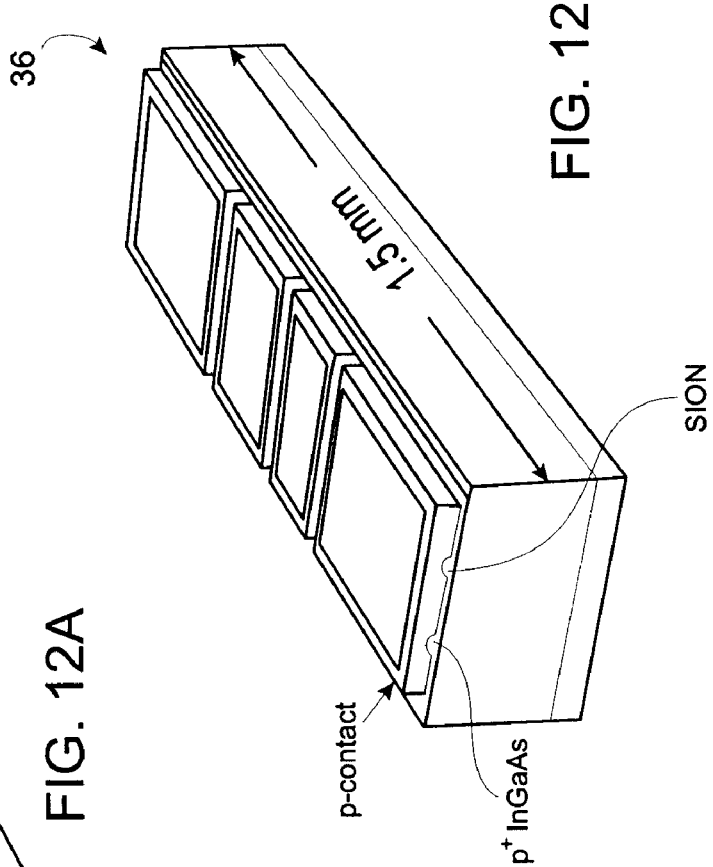
FIG. 12A
FIG. 12B

US 6,724,789 B2

DENSE WAVELENGTH DIVISION MULTIPLEXING (DWDM) FIBEROPTIC SOURCE

CROSS-REFERENCES TO RELATED APPLICATIONS

The present non-provisional application claims the benefit of priority from U.S. Provisional Patent Application No. 60/256,111 filed Dec. 14, 2000, the full disclosure of which is incorporated herein by reference.

BACKGROUND OF THE INVENTION

The present application is generally related to optical communication and signal generation devices, systems, and methods. In one embodiment, the invention provides a multiple channel fiberoptic light source, particularly for use in dense wavelength division multiplexed systems (DWDM).

Optical telecommunications networks would benefit from increased bandwidth to handle both the current and projected communications traffic. Many optical networks use a single laser transmitter with time division multiplexing techniques to transmit separate data streams. The advantageous properties of optical fiber allow quite significant data rates to be transferred using such single laser systems. Nonetheless, to allow even greater data rates to be transmitted, the current market trend is toward systems that use many different wavelengths. Simultaneous transmission of these different wavelength signals can significantly increase data capacity of a fiberoptic communication link. This approach is known generally as wavelength division multiplexing ("WDM").

WDM systems have significantly increased the capacity of each fiberoptic communication link within the system. As with many successes, still further improvements would be desirable. To increase the number of channels or distinct frequencies transmitted across an optical fiber, it has been proposed to decrease the frequency separation between adjacent channels so as to more densely transmit data within a spectral range. Such dense wavelength division multiplexing ("DWDM") optical communications networks show great promise in providing increased data communication capabilities and bandwidth. Unfortunately, as the adjacent channels get closer and closer in spacing, the likelihood of error (from signal frequency instability, cross-talk, and the like) increases.

The reliability and accuracy of data transmissions using DWDM systems are particularly sensitive to the stability and reliability of the light generating structures. A variety of techniques have been used for individually controlling each laser which generates the light for a particular channel within a DWDM system. While the cost of individual laser diodes has dramatically decreased, the price of a multiple wavelength (channel) light generation devices, together with control systems for accurately maintaining stable and tightly packed channel frequencies, can be quite expensive.

In work related to the present invention, it has recently been proposed to flexibly combine a plurality of tunable laser diodes together so as to form a reconfigurable multi-channel transmitter for DWDM optical communications. U.S. patent application Ser. No. 09/610,312 filed on Jul. 5, 2000 (assigned to the assignee of the present invention) describes this advantageously reconfigurable multi-channel transmitter in detail, and the full disclosure of that application is incorporated herein by reference.

While the recently proposed reconfigurable multi-channel transmitter represents a significant advancement in the art, still further refinements would be desirable. In general, it would be beneficial to provide improved structures, systems, and methods for generating light for use in optical signal systems. In particular, it would be beneficial to provide improved light sources for fiberoptic communications. It would be particularly beneficial to provide improved combinations and/or arrangements of components for generating optical signaling light, ideally resulting in simple structures and providing highly reliable and stable light at a plurality of tightly controlled channel frequencies for a reasonable cost.

BRIEF SUMMARY OF THE INVENTION

The present invention generally provides improved structures and systems for generating light for use in optical communications systems, together with related methods for their fabrication and/or use. In one embodiment, the invention provides an optical light source for use in wavelength division multiplexed and dense wavelength division multiplexed systems. In some embodiments, a reference gas may be contained by a hermetically sealed enclosure of the device itself, which is also used to protect lasers or other light generating structures. Laser injection current control and thermal management systems may together provide feedback control of the light generating lasers and/or a frequency grid generator such as an etalon. Electronic control over a number of separate lasers (and the grid) may be effected using a multiplexed digital controller.

In a first aspect, the invention provides a light generating structure comprising a sealed enclosure with a light source disposed within the enclosure. A waveguide has an entrance disposed within the enclosure in an optical path from the light source. A reference fluid is contained by the enclosure itself. The reference fluid imposes a reference characteristic on light from the light source.

The waveguide may comprise an optical fiber, for example, which can transport light outside the enclosure. In many embodiments, the reference characteristics will comprise a reference wavelength. The reference fluid will often comprise a reference gas, and may absorb light energy at the reference wavelength. The light source will often comprise a frequency adjustable laser, and a sensor may couple the light (with the reference characteristic imposed thereon) to the frequency adjustable laser along a feedback control circuit so as to frequency stabilize the laser by use of the reference wavelength.

Advantageously, a plurality of lasers can be disposed within the enclosure, with the reference gas imposing the reference characteristic upon light traveling from each laser. The waveguide will often comprise an optical fiber, the waveguide entrance comprising a first end of the optical fiber, and the optical fiber extending outside the enclosure to a second optical fiber end. Additional optical fibers may similarly be provided for the additional lasers for transmission of light from the lasers out of the enclosure.

The use of (for example) a hermetically sealed enclosure which protects the lasers as a reference gas cell significantly facilitates the miniaturization of light sources having reference gas stabilized frequencies. Fiberoptic enclosures are often quite small, and accurate detection of the reference wavelength may be easier if the light travels a significant distance through the reference gas. Hence, a length of the optical path through the reference fluid within the enclosure will often be greater than a length of the enclosure, the optical path typically comprising a folded optical path reflected by at least one reflecting element within the enclosure. This allows, for example, the reference gas to sufficiently absorb energy along a characteristic wavelength for easy and accurate wavelength control, without having to resort to a large, separately sealed gas cell disposed within the enclosure.

In another aspect, the invention provides a fiberoptic source comprising a sealed enclosure, with a first variable-frequency laser disposed within the enclosure. An optical fiber has an entrance disposed within the enclosure in an optical path from the laser. The fiber extends out from the enclosure, and a reference gas is contained by the enclosure. The reference gas tags light from the laser with a reference frequency. Feedback control circuitry couples the tagged light to the laser so as to control a frequency of the light in response to the reference frequency.

The reference gas typically tags the light via light absorption, which occurs at a characteristic frequency or frequencies of the (often narrow) absorption lines of the gas. In many embodiments, a plurality of frequency-adjustable lasers will be provided, each laser producing an additional light signal having a signal frequency. The signal frequencies may be adjusted in response to the reference frequency. A frequency adjustable etalon may be disposed in an optical path from at least one of the lasers. The etalon may generate interference fringes at a plurality of discretely separated frequencies. An etalon control loop may be coupled to the etalon to stabilize the separated frequencies of the etalon in response to the reference frequency. The feedback control circuitry may include a plurality of control loops coupled to the additional lasers for adjustment of the signal frequencies of the additional lasers in response to the separated frequencies of the etalon. The feedback control circuitry may comprise a multiplexer disposed along the feedback control loops so as to provide sequential adjustment of the etalon and the lasers. In some embodiments, the optical path from the first laser to the entrance of the optical fiber will be disposed adjacent a first end of a laser cavity, while the light to be tagged by the reference gas may be refracted from the second end of the laser cavity.

In another aspect, the invention provides a light generation structure comprising a plurality of variable-frequency light sources. The light sources each generate an associated light signal. A frequency grid generator has a structure defining a plurality of discrete fringe frequencies. A spacing between the discrete frequencies is substantially fixed. A digital controller transmits signals to selectively alter frequencies of the generated light. A multiplexer sequentially couples the controller to the light sources and the frequency grid generator so as to maintain each of the light signals in alignment with an associated discrete frequency of the frequency grid.

Typically, the frequency grid generator will comprise a variable frequency grid generator having optical interference fringes defining a frequency comb, and allowing the discrete frequencies of the comb to be varied in unison, the exemplary grid generator comprising an optical etalon or the like. A frequency reference may provide frequency reference information to the digital controller, so as to effect control over the position of discrete frequencies of the frequency comb. Control over the frequency grid may be effected by controlling temperature of the grid generator, ideally using a resistive heater and a thermistor for coarse temperature feedback.

In some embodiments, light sensors may be coupled to the digital controller for sensing associated light frequencies of light from each of the lasers, while temperature sensors are coupled to each of the lasers for sensing an associated temperature thereof. Heaters may also be thermally coupled to each laser, with the digital controller effecting temperature feedback control of the lasers. Frequency feedback control of the lasers may be effected in response to the associated light frequency as sensed by the light sensors, while the temperature feedback control may maintain a frequency adjustment range of each laser along a desired range. This allows, for example, high speed frequency tuning of the laser light to be effected by adjusting the injection current (for maintaining a signal at a desired channel frequency, for example) while using thermal control of the laser for larger, slower changes (for example, to select the channel for a particular laser, to maintain the injection current roughly centered within an adjustment range, and the like).

In another aspect, the invention provides a fiberoptic source comprising a plurality of variable-frequency lasers. Each laser generates light having a frequency which varies with the temperature of the laser. A frequency grid generator has a structure defining a plurality of discrete interference fringe frequencies. The discrete frequencies vary (often as a set) with the temperature of the grid generator. A controller is coupled to the lasers and the frequency grid generator. The controller varies the temperature of the grid generator in response to a reference frequency by selectively heating the grid generator. The controller varies the temperatures of each lasers to associate the lasers with discrete frequencies of the grid generator by selectively heating the lasers. A heat sink is thermally coupled to the lasers and the grid generator. One of the lasers or the grid generator defines a minimum desired cooling device, typically establishing a minimum desired cooling level. The heat sink maintains the minimum desired cooling device sufficiently cool to allow the controller, via the heaters, to effect feedback control of the light frequencies, optionally to associate the frequencies of the laser light with desired discrete frequencies of the grid generator.

Typically, each laser generates light having a frequency which varies with injection current, as well as with the temperature of the laser. An etalon is often employed as the grid generator, the etalon defining a frequency comb. The discrete fringe frequencies of the etalon vary relatively slowly (often as a set) with the temperature of the etalon. By varying the etalon temperature in response to a gas absorption line or other reference frequency, the frequency grid or comb generated by the etalon can have a fringe positioned so that it coincides with the reference frequency. This can be achieved by tuning the etalon to the position of transparency at the frequency of a laser tuned to the absorption line. In this way, the frequency grid of the etalon becomes referenced or "anchored" to an absolute reference. Typically, a thermoelectric cooler (TEC) maintains the temperature of the structure at the lowest point required by any of the devices on the source. All other devices can be brought to their respective operating temperatures by selective localized heating performed by associated microheaters attached to laser submounts or the etalon plate.

In yet another aspect, the invention provides a fiberoptic source assembly comprising an enclosure with a plurality of lasers disposed within the enclosure. A plurality of waveguide entrances are provided, with each entrance in a first optical path from an associated laser. A plurality of sensors are optically coupled to the lasers, and a controller couples the sensors to the lasers so as to effect independent feedback control over the light generated by the lasers.

In some embodiments, each laser will have a cavity with a first end and a second end, and the waveguide entrances will be optically coupled to the laser cavity through the first end. The sensors may be disposed in a second optical path from the second end of the lasers, thereby taking advantage of what is sometimes considered "leakage" light emanating from the back end of the laser cavity. The lasers may be disposed between first and second sets of reflecting elements so that at least one of the optical paths within the enclosure is longer than the enclosure. Each reflecting element may comprise a prism, mirror, or the like, and may be used for a plurality of separated optical paths, for example, by folding the optical paths along parallel planes and positioning the lasers so that the optical path planes are separated along the reflecting prisms. In some embodiments, a plane or substrate may support the sensors. Conveniently, the substrate may extend across the light generated by the lasers, with a portion of a folded optical path from the lasers optionally traversing through the substrate at a window or opening through the substrate.

BRIEF DESCRIPTION OF THE DRAWINGS

FIGS. 12A and 12B illustrate tunable lasers for use in the fiberoptic source of FIGS. 2A and 2B.

DETAILED DESCRIPTION OF THE INVENTION

The present invention generally provides improved structures and systems for generating light for use in optical communication networks and systems along with related methods for generating light and for fabricating light generators. The invention generally uses a plurality of lasers, with at least one (and often each) of the lasers actively locked to a absorption cell. Gas absorption at one or more narrow spectral lines provides a particularly convenient absolute frequency reference. The individual lasers may each be assigned to a particular (and often unique) channel, with the frequencies for lasers assigned to adjacent channels typically being equally spaced in wavelength according to an optical channel standard such as the one prescribed by the International Telecommunication Union (the "ITU grid"). Any grid spacing between adjacent frequencies of 250 GHz or less may be used within the present invention, often being 100 GHz or less, optionally being 50 GHz or less, in some cases being 25 GHz or less, and in some embodiments being as low as 1 GHz or less.

Wavelength spacing may conveniently be maintained with reference to a wavelength or frequency interference fringe comb or grid generator, such as an etalon, an Arrayed WaveGuide ("AWG"), or the like. In general, the grid generator will have a series of discrete interference fringe frequencies, with the spacing between adjacent frequencies being fixed. Such a grid generator is particularly advantageous as a channel reference for maintaining wavelength separation. While the spacing between frequencies typically will not vary, the overall set of frequencies may be altered as a group, often by varying a temperature of the grid generator or the like.

Figure 1:
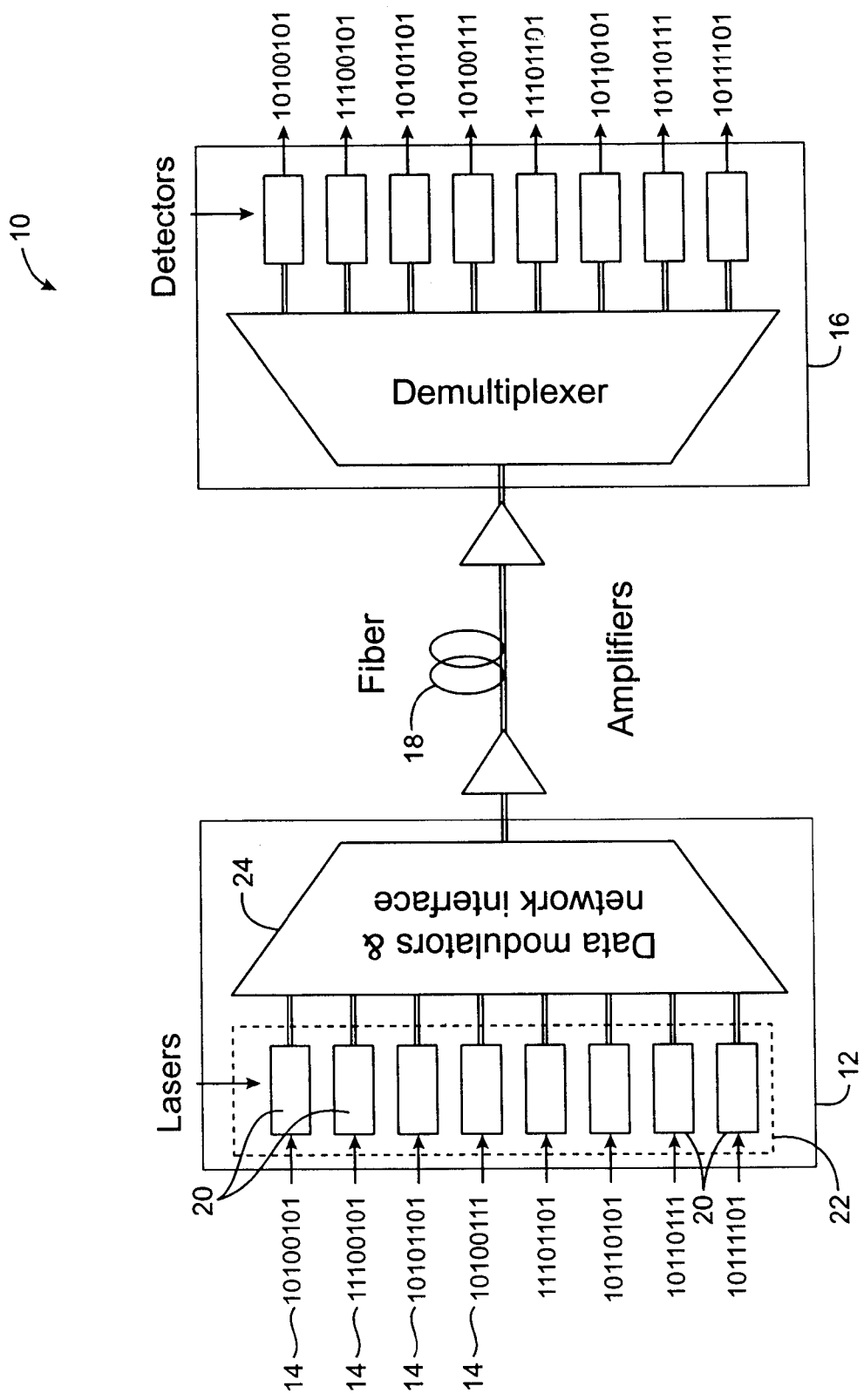
FIG. 1 schematically illustrates an overview of a dense wavelength division multiplex (DWDM) system according to the present invention.

Referring now to FIG. 1, a DWDM communication system 10 generally includes a transmitter 12 sending signals at a series of discrete frequencies or wavelengths, with each discrete wavelength comprising a channel 14. Transmitter 12 directs the channels of data to a receiver 16 via an optical fiber 18, with the signals often being amplified during transmission, as is well-known in the art. The signals for each wavelength or channel will be generated by a laser 20.

As used herein, the term "an optical source" encompasses a group of lasers 20 packaged together as a unit 22. Light from each of the lasers 20 may be manipulated by data modulators and introduced into fiber 18 a network interface in or more separate system components 24, as illustrated in FIG. 1. Alternatively, modulation of the light signals may be performed internally within source 22 using direct modulation. Such direct modulating sources may benefit from electronic shielding between the high frequency modulating electronics, the laser frequency control electronics, and the like.

It should be understood that not all of the lasers for every channel of a DWDM transmitter need be packaged together within a single source 22. In many embodiments, a plurality of sources may be combined together within a transmitter 12, with the individual source modules typically being mounted to a rack for individual removal and replacement. Each source 22 will typically include at least four lasers, often having more than six lasers, with the exemplary source having ten lasers. As described in more detail in related U.S. patent application Ser. No. 09/610,312, previously incorporated herein by reference, at least some of the lasers may be flexibly assigned to any of a plurality of different channels, allowing the source to be flexibly configured with, for example, the ability to include one or more redundant lasers for replacement of a failed laser within the source. In the exemplary embodiment, eight (8) channels are included with two spare lasers.

Figure 2A:
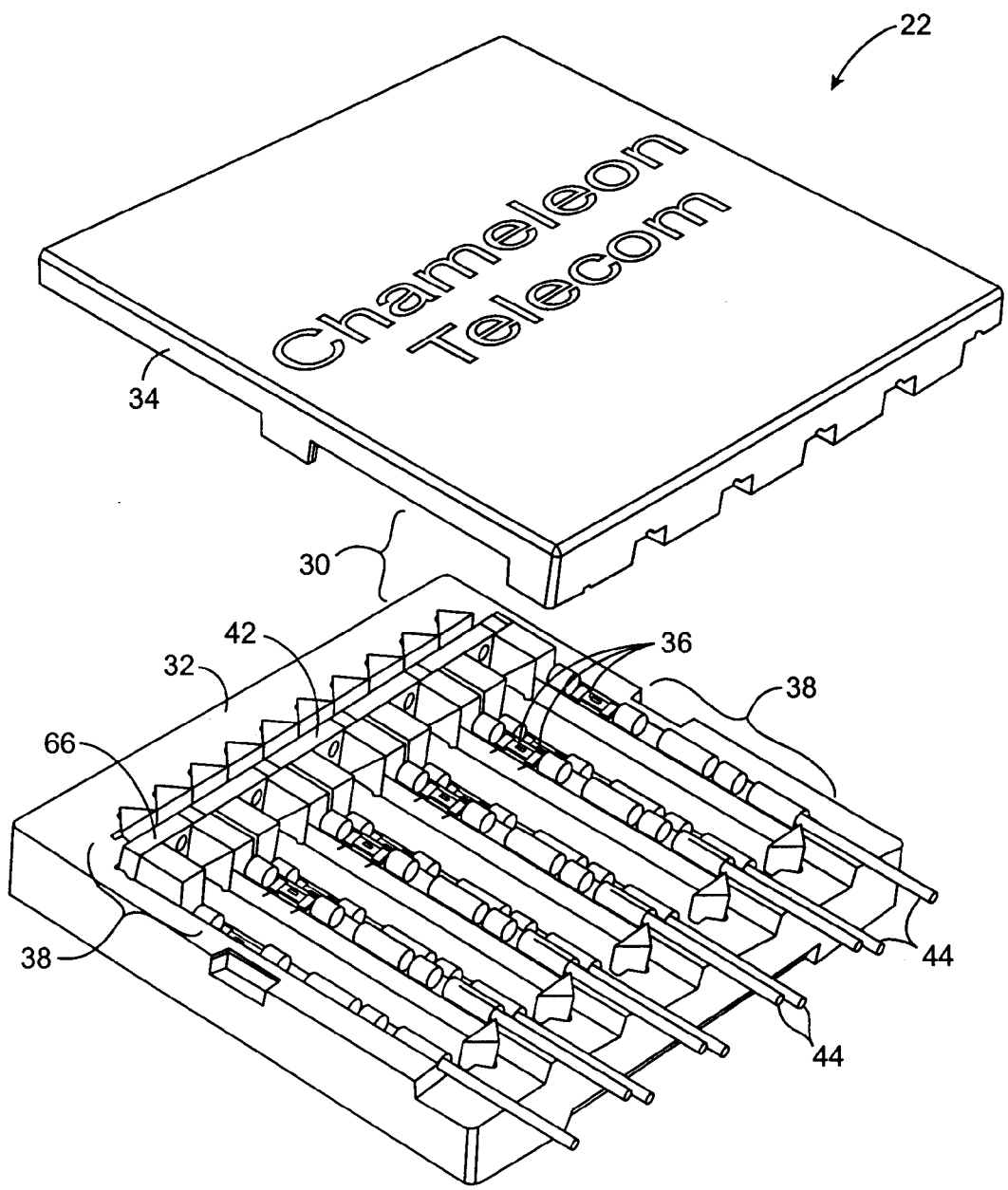
FIGS. 2A and 2B are perspective views from above and below, respectively, of a fiberoptic source for use in the system of FIG. 1, with the cover of the source separated from a base to show interior components and features of the source.
Figure 2B:
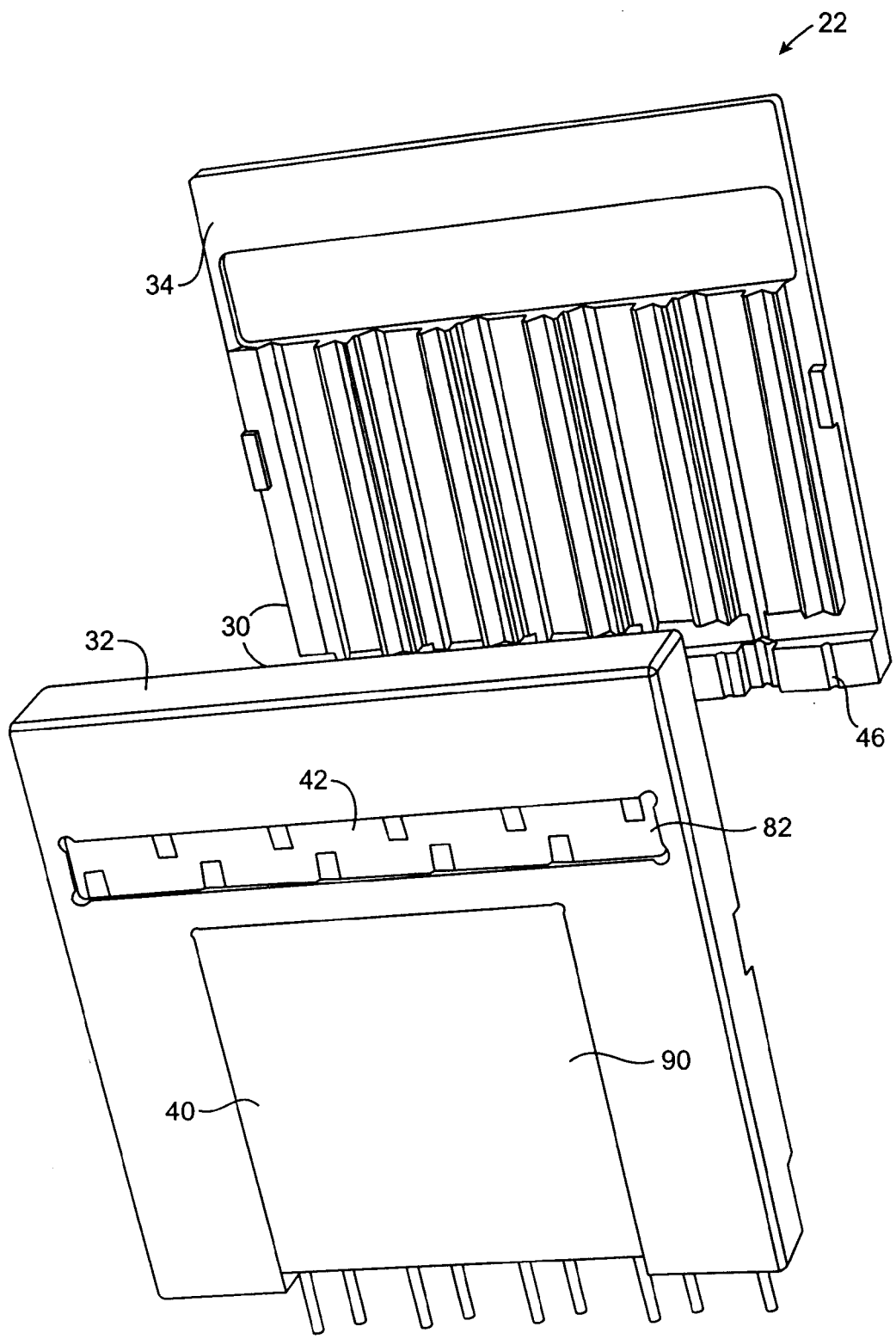

Referring now to FIGS. 2A and 2B, the exemplary source 22 includes an enclosure 30 comprising a base 32 and a cover 34. The exemplary fiberoptic source makes use of an optical subsystem, an optomechanical support subsystem, a thermal management subsystem, and an electronic control subsystem. These subsystems are combined for use in generating light at a series of discrete channels, with the combined light generating structure generally referred to herein as a fiberoptic source. Not all components of each of these systems need be packaged within source 22, for example, an external digital processor may be coupled to printed circuit boards of source 22 by electrical connector leads. Hence, enclosure 30 generally contains lasers 36, together with components of an optical system 38, components of a thermal management system 40, and components of an electronic control system 42.

The enclosure or can 30 may be used to contain a reference gas, so that a gas absorption cell used for frequency referencing is embodied by the enclosure. Enclosure 30 may be permanently sealed, for example, by laser welding. Lifetimes of 20 years or more are common for such enclosures. An optical fiber extends out of enclosure 30 for each laser 36, the optical fiber having an end (or other optical entrance such as a coupler or the like) disposed within enclosure 30 so as to act as a waveguide for transmission of light energy from lasers 36 out of the.

Base 32 and cover 34 of enclosure 30 may include surface features which fittingly receive optical components 38, lasers 36, fibers 44, electrical control components 42, and/or thermal management components 40. In the exemplary embodiment, base 32 comprises an optical microboard including indexed surfaces and features to facilitate the alignment of the optical components. For example, v-grooves 46 support optical fibers 44 in alignment with optical components 38, which are positioned (at least in part) by corresponding channels. Recesses within the optical microboard may similarly receive and position miniature printed circuit boards for use in the electrical control system, the thermal control system, a thermo-electric cooler, and the like.

Figure 3:
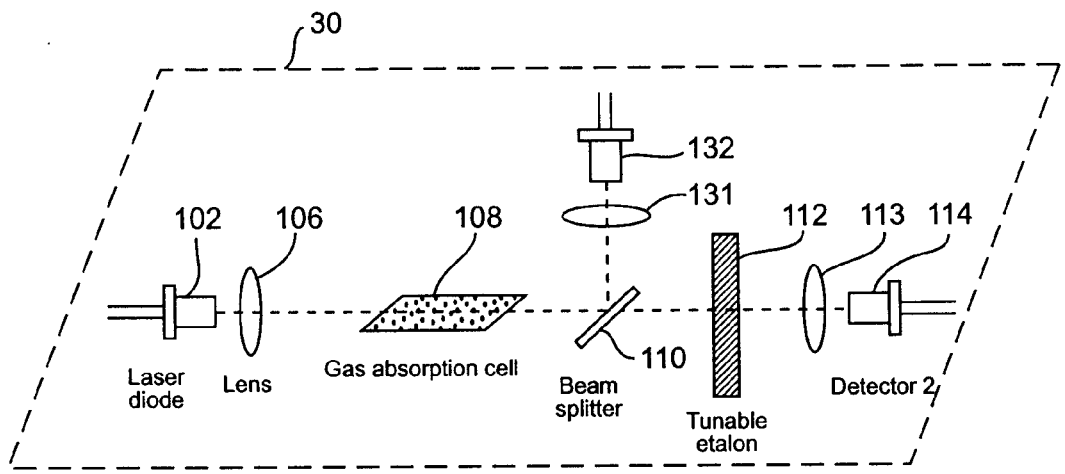
FIGS. 3 and 3A are schematic diagrams showing the basic components of two embodiments of a frequency stabilized lasers that might be used for one channel of a fiberoptic source similar to that of FIGS. 2A and 2B.
Figure 4:
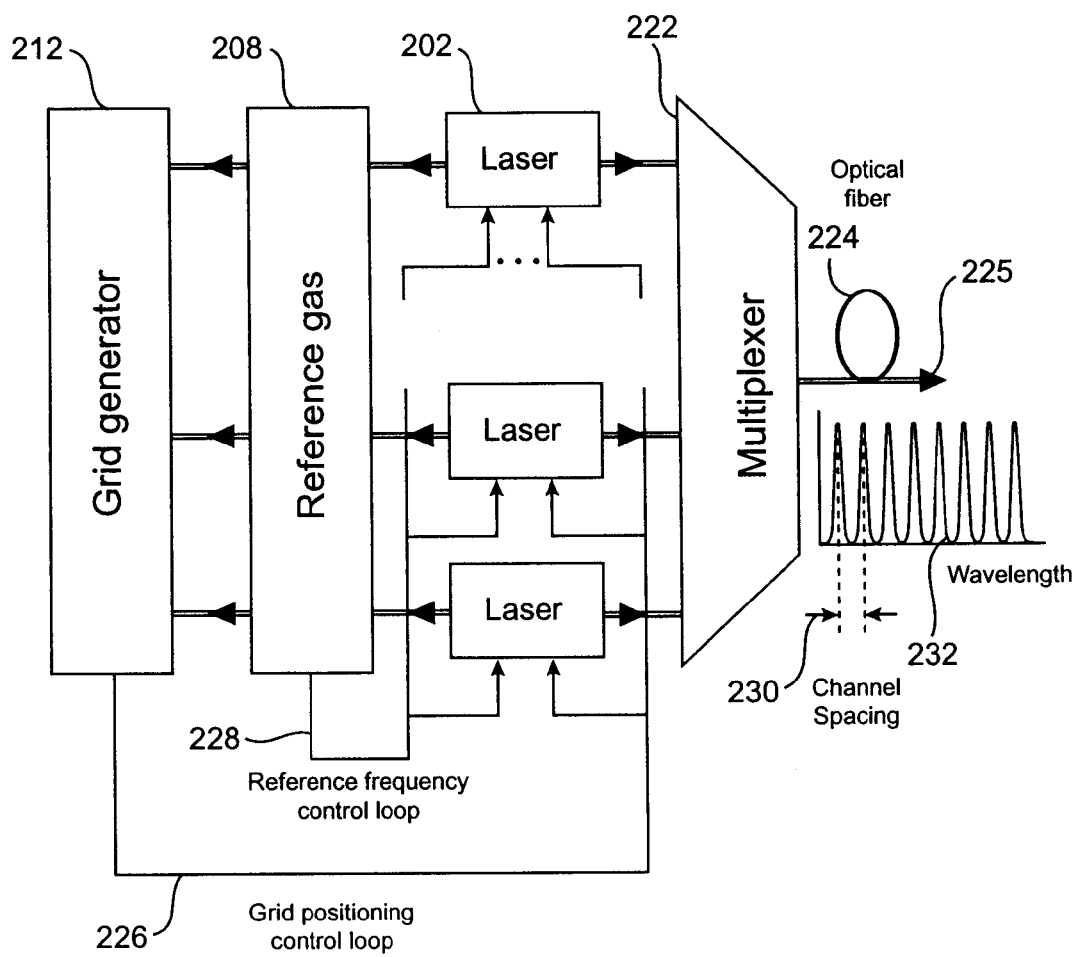
FIG. 4 is a schematic diagram showing an embodiment of a reconfigurable multi-channel DWDM transmitter that might be used in fiberoptic source similar to that of FIGS. 2A and 2B.
Figure 4A:
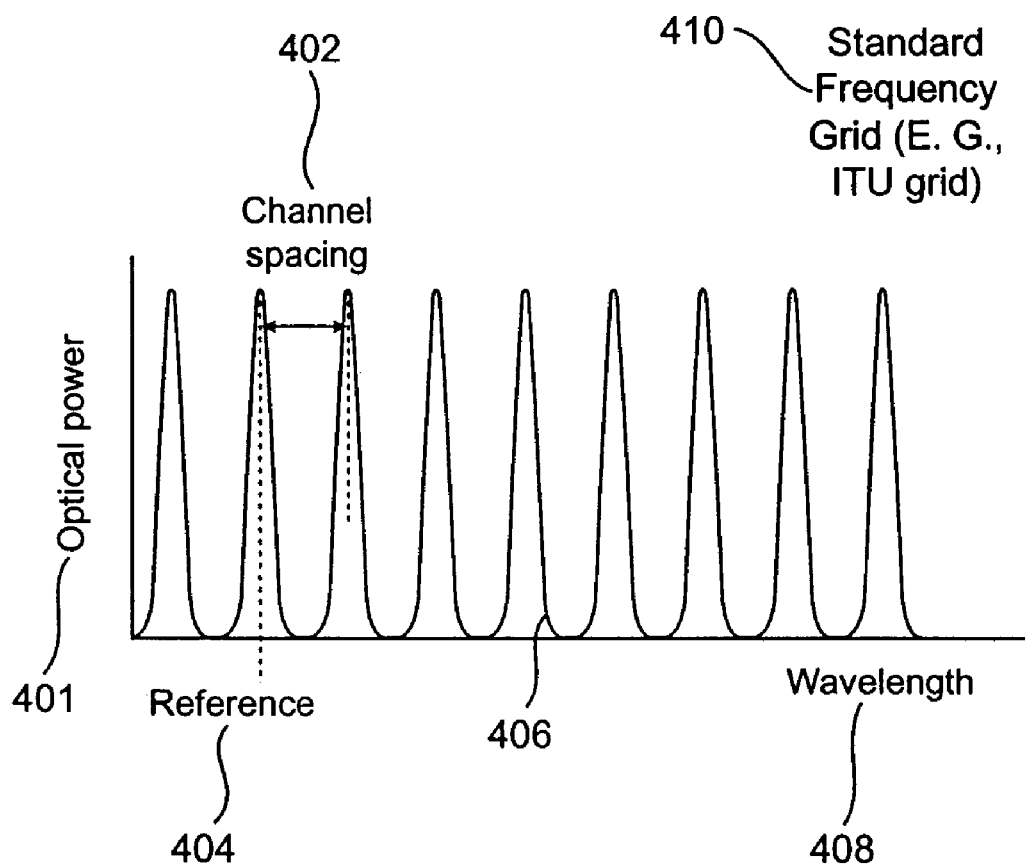
FIG. 4A is a graphical display illustrating the output produced by the multi-channel fiberoptic source of FIGS. 2A and 2B.

Embodiments of frequency stabilized laser channels of source 22 may generally be understood with reference to FIGS. 3 through 4A. FIG. 3 shows the basic components of a frequency stabilized diode laser wherein stabilization occurs through a spectral line absorbance of a reference gas. An overview of the operation for one channel starts with a laser source 102, in this case a tunable diode laser. Alternative tunable lasers or other light sources may also be used. The laser light is directed into a collimating lens 106 and through a gas absorption cell 108, the gas absorption cell comprising a chamber holding a gas of known spectral line characteristics. This gas is used to lock onto a reference frequency (or wavelength) using wavelength modulation spectroscopy ("WMS"), also known as derivative spectroscopy. A beam splitter 110 can be used to forward a part of the beam through a lens 131 and to a photodetector 132 which enables the laser frequency to be compared and tuned to a spectral line frequency of the known gas in the reference cell 108. Such an arrangement is described in more detail in U.S. patent application Ser. No. 09/610,312.

As mentioned above, rather than making use of a gas absorption cell 108 disposed within enclosure 30, the reference gas may instead by contained by enclosure 30 itself. As used herein, a gas or other fluid is "contained by" an enclosure when the enclosure acts as a barrier inhibiting leakage of the gas (or other fluid). Hence, when a sealed gas absorption cell 108 is disposed within an enclosure 30, with the gas absorption cell constraining the gas therein, the reference gas is not "contained by" the enclosure, even though the reference gas is contained within the enclosure.

In use, diode laser 102 may be turned on, and locked to a gas absorption line from gas absorption cell 108 using a standard WMS technique. Detector 132 may be used to monitor light transmission through the reference gas, and a reference frequency control loop making use of a microprocessor can provide feedback tuning of laser 102 in response to the reference frequency. The reference gas may comprise any suitable gas. For example, acetylene ($C_2H_2$) and hydrogen cyanide (HCN) have numerous well-known narrow absorption lines in the 1550 nm optical communications window. Other gases may be used for this or other windows as desired.

Figure 3A:
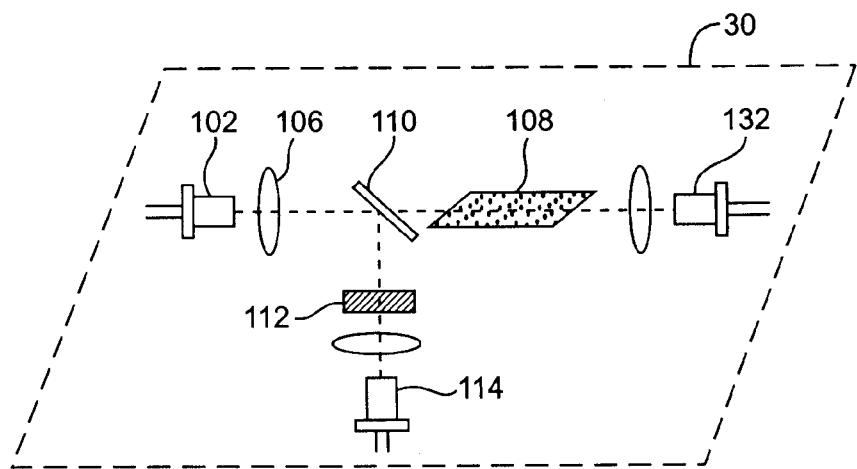

The frequency stabilized diode laser may be frequency locked to a sequential fringe of a temperature tunable stable Fabry-Perot etalon 112. The beam proceeds through to the etalon 112 which is tuned to a position wherein etalon transmission fringe coincides with the laser wavelength locked to the reference spectral line derived from the reference gas. Passing through a lens 113 and onto a second detector 114, the transmission is monitored for tuning. The free-spectral range of the tunable etalon 112 is chosen to be equal to the desired frequency grid spacing (for example, according to the ITU standard), so that etalon 112 transmission spectrum consists of a series of regularly spaced transmission peaks. Each of these transmission peaks will constitute a frequency reference for a data transmission channel when fully initialized, tuned, and configured. FIG. 3A shows an alternate arrangement, in which beam splitter 110 separates light from laser 102 prior to tagging of the light with the reference frequency. This allows photo detector 132 to compare light output from laser 102 to the fringes of etalon 112 without reference gas absorption effects, providing clean feedback for use as an error signal.

FIG. 4 is a block diagram showing one embodiment of a multi-channel reconfigurable DWDM transmitter. The channel shown above in FIG. 3 is just one of n channels in a bank. Referring to FIG. 4, one common gas cell 208 comprising a gas of a known spectral line frequency and one etalon, also called the grid generator 212 establish a stable frequency grid for a plurality (n) number of independent active lasers 202 and therefore (n) channels. All lasers 202 have the same reference data structures since they all transmit through the same gas cell 208 and are locked onto successive fringes produced by common etalon 212. The reference frequency control loop 228 enables initialization and tuning of each laser in the bank to the reference spectral frequency derived from gas cell 208 in a well known manner . The grid positioning control loop 226 sequentially tunes each independent active laser 202 in the bank to one of the fringe frequencies of grid generator 212 using the grid positioning control loop 226 for stabilizing and controlling the fringe frequency position.

Direct monitoring of output wavelength within grid positioning control loop 226 and reference frequency control loop 228 is used to stabilize lasers 202. Direct wavelength monitoring is achieved by using well known laser wavelength modulation spectroscopy techniques applied independently. The optical fiber output carries different wavelength light 232 at uniform channel spacing 230.

Referring now to FIG. 4A, a graphical representation of a waveform is illustrated to show the output produced by a multi-channel optical source. The transmission spectrum is shown as optical power 401 as a function of wavelength 408. The reference source wavelength 404 provides an anchor for a uniform spacing output grid, such as ITU grid 410, which may be defined by a etalon with a specified channel spacing. ITU grid 410 may comprise frequencies with channel spacings 402 which comply with ITU standards.

Preferably, laser tuning is accomplished using at least two control loops. The first control loop may selectively shift the frequency grid as a unit. This may be effected, for example, by controlling a temperature of the etalon to which lasers are referenced. The second loop sequentially locks each of the lasers to a particular point on the frequency grid or comb.

Figure 5:
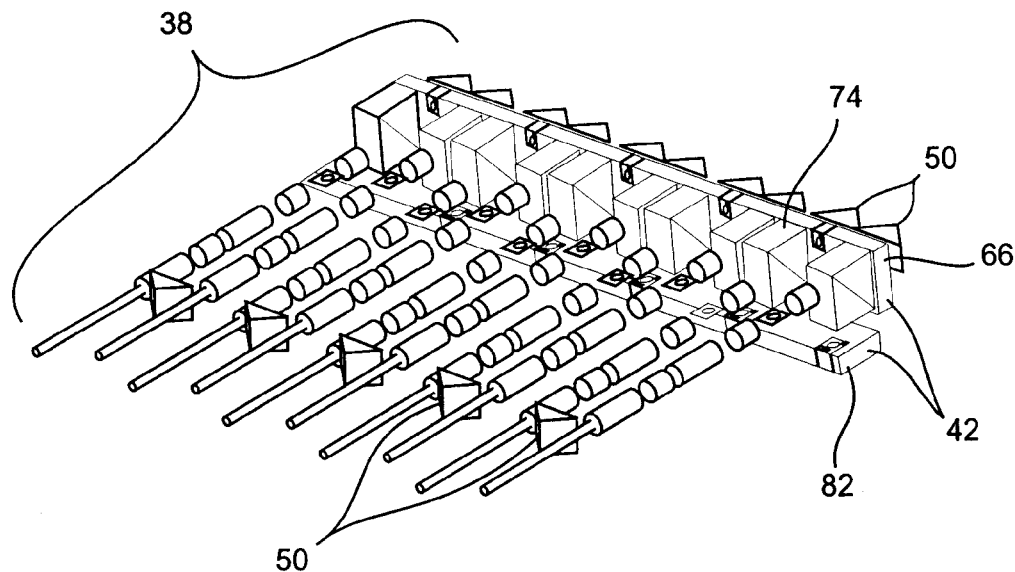
FIG. 5 is a perspective view showing optical and electrical components of the fiberoptic source of FIGS. 2A and 2B.

The arrangement of components supported by enclosure 30 are shown in isolation in FIG. 5. The optical components defining the optical paths within source 22 will first be described with reference to FIGS. 5, 5A and 5B. Additional optical components will then be described with reference to FIGS. 5, 6A and 6B; and electrical system components 42 will then be described with reference to FIGS. 5A, 5B, 7 and 8. The control and thermal management of the components will then be described with reference to FIGS. 10 and 11.

Enclosure 30 (see FIG. 2A) generally has dimensions of less than 2 inches in length by 2 inches in width by less than ⅓ inches in thickness. The exemplary embodiment for 10 lasers has a length of about 1½ inches and a width of about 1½ inches. For ideal absorption of light energy along the reference wavelength, the light will preferably be transmitted through the reference gas for a distance which is greater than the length of enclosure 30. To allow the light energy from laser 36 to be transmitted through the reference gas by a distance greater than the length of enclosure 30, a folded optical path within enclosure 30 may be provided. Such a folded optical path is generally provided by reflecting elements such as prisms 50. In the exemplary device illustrated in FIGS. 5A and 5B, the prisms 50 defining a folded path length are used twice, with two layers of the laser/detectors stacked vertically.

Figure 5A:
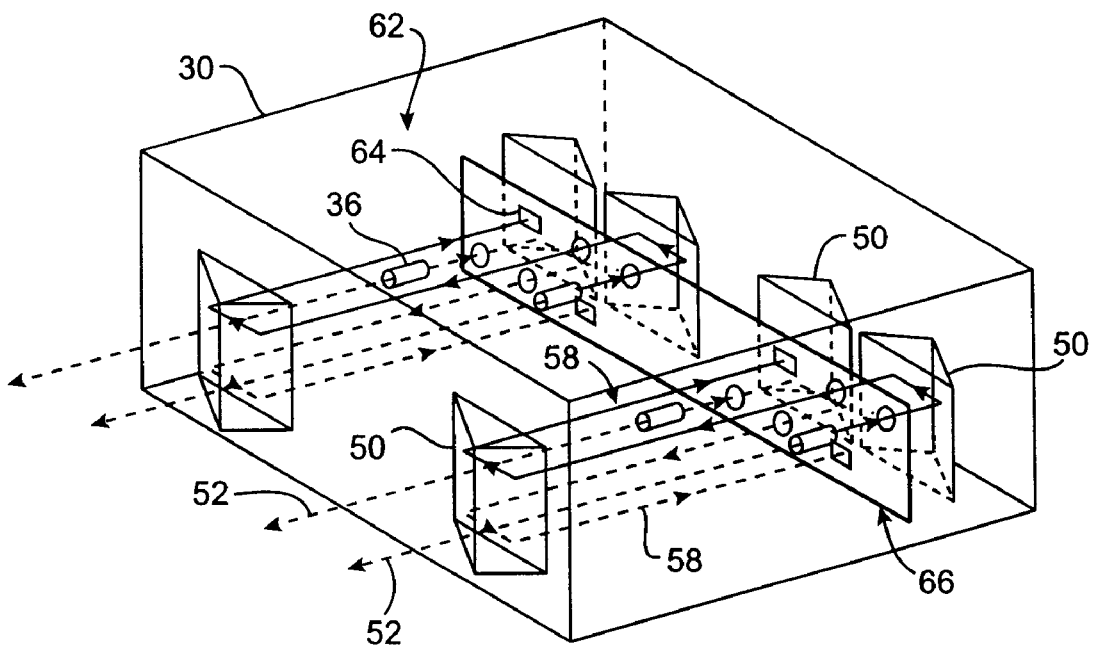
FIGS. 5A and 5B illustrate optical paths defined by the optical components of FIG. 5.
Figure 5B:
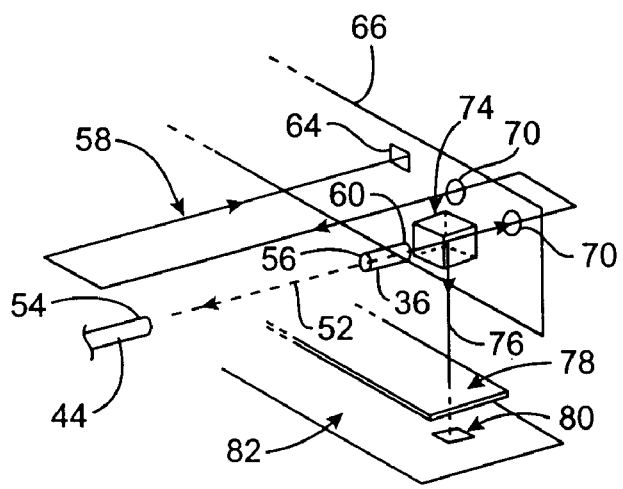

The optical paths for a single laser 36 within source 22 is illustrated (with many components omitted for clarity) in FIG. 5B. Laser 36 will generally include a cavity having a first end and a second end, with the cavity of a semiconductor laser presented by the facets of the crystal. In the exemplary source, a first optical path 52 from laser 36 to an end 54 of an associated optical fiber 44 is disposed adjacent to a first end 56 of the laser 36. A second optical path 58 makes use of light refracted from a second end 60 of laser 36. In other words, the primary output beam of each laser is coupled to its respective optical fiber, while the back-facet "leakage" beam (which is present with many lasers) is used for laser diagnostics.

Referring now to FIGS. 5B and 5A, second optical path 58 from second end 60 of laser 36 is reflected along the length of enclosure 30 through reference gas 62 by prisms 50. Second optical path 58 terminates at a light sensor 64, the exemplary light sensor comprising a photodiode supported by the substrate of a printed circuit board 66. In the exemplary embodiment, second optical path 58 passes through openings 70 in circuit board 66, allowing the circuit board to be disposed across the optical paths between prisms 50. Photodiode 64 generally monitors the frequency of light output by the associated laser 36. As can be understood with reference to FIG. 5A, a plurality of lasers 36 and associated photodiodes 64 may make use of at least one common prism 50 by arranging the second optical path 58 with a planar configuration, and offsetting the planes of lasers and associated photodiodes, as shown. The length of the optical path through reference gas 62 will preferably be over 40 mm, ideally being at least about 70 mm.

Figure 7:
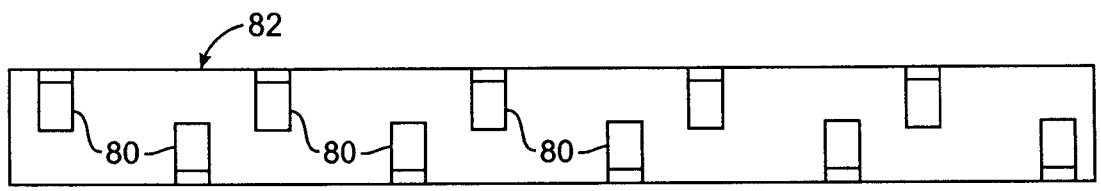
FIGS. 7 and 8 show substrates with sensors for use in the multi-channel fiberoptic source of FIGS. 2A and 2B.
Figure 8:
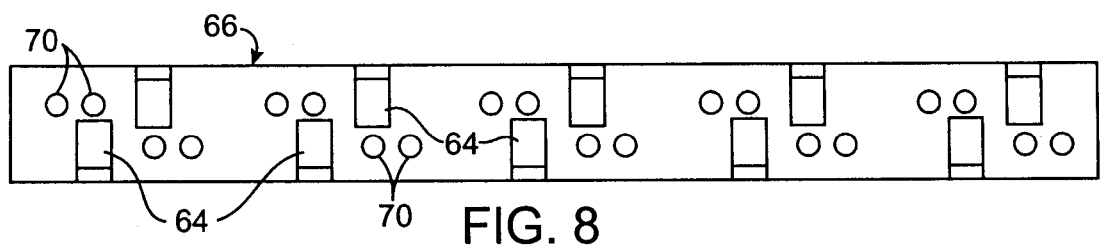

As can also be seen in FIG. 5B, a beam splitter 74 directs light from laser 36 along a third optical path 76. Third optical path 76 traverses etalon plate 78 and terminates at a frequency grid photodiode 80, which is again supported by an associated photodiode printed circuit board 82. An exemplary arrangement of printed circuit boards for supporting reference wavelength photodiodes 80 and frequency feedback photodiodes 64 are shown in FIGS. 7 and 8, respectively. The available space on the miniature printed circuit boards 66, 82 which is not dedicated to photodiodes 64, 80 may be used for the electronic circuitry which is beneficially disposed close to the photodetectors (such as signal preamplifiers and the like) in surface mounted or other miniature packaging. The back facet or leakage laser beam is generally of lower energy than the primary beam directed into optical fiber 44. It is this lower energy beam which is split by beam splitters 74, with a portion of the light directed through the reference gas for gas absorption at the reference frequency and monitoring of the absolute laser wavelength output. The other portion of the back facet laser light energy is directed downward through the etalon plate, with the etalon having a plate thickness corresponding to the desired spacing between the discrete frequencies of the frequency comb, (or its submultiple).

Figure 6B:
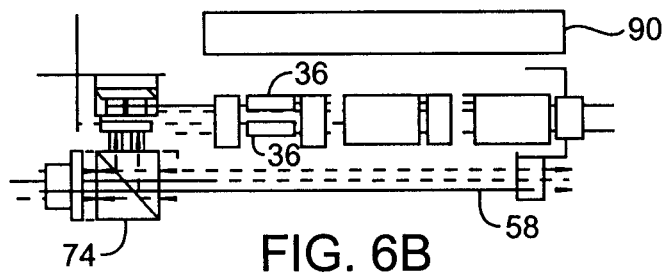
FIGS. 6A–6C are plane, side and end views of the components shown in FIG. 5.
Figures 6A, 6C:
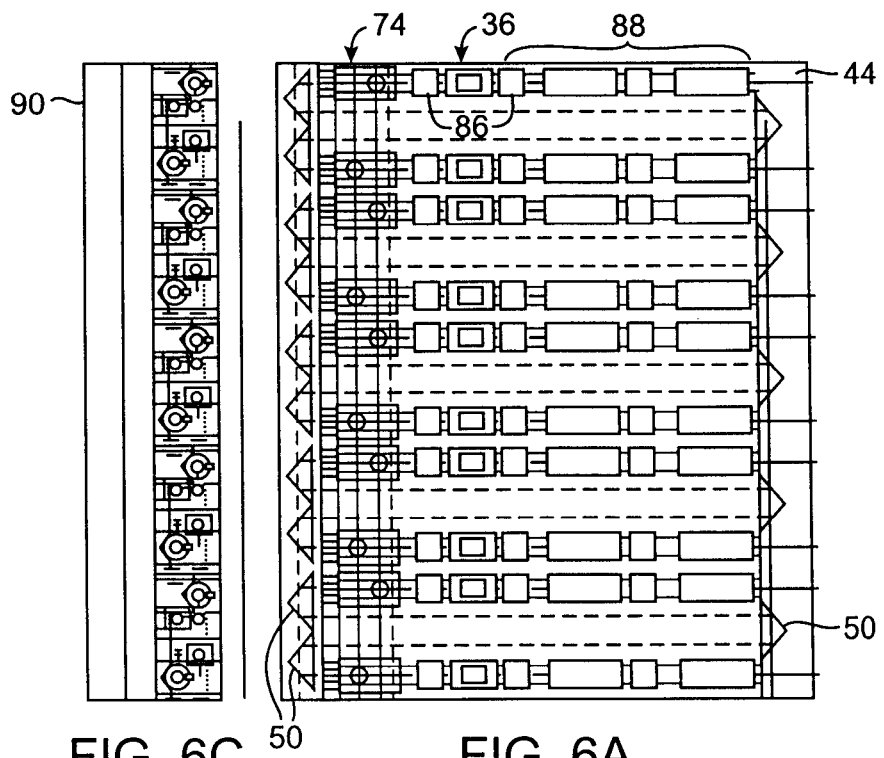

Referring now to FIGS. 6A–6C, the optomechanical platform for a 10-laser source is presented in a computer-assisted drawing format. To appreciate the size of the device, it should be noted that each prism 50 (optionally being an off the shelf item) may measure as little as 3×3×4.2 mm or less. The vertically stacked laser/photodiode pairs used in common prism reflectors are clearly seen in FIG. 6B, in which the second optical path 58 through the reference gas 62 and beam splitters 74 have been offset vertically from the laser and associated optics for clarity. Standard collimating lenses 86 are used to adapt the laser beams to enhance free space propagation. Similarly, standard laser to fiber coupling and isolation optics 88 are disposed along the first optical path to efficiently couple laser 36 to optical fiber 44. Collimating lenses 86 may comprise GRaded INdex ("GRIN") lenses, or spherical or other known collimating lenses may be used. Optical isolators preferably based on the common Faraday type can be used. Such isolators are commercially available from many vendors. Optomechanical drawings such as those illustrated in FIGS. 6A–6C are generally sufficient for fabrication of source 22.

Also seen in FIGS. 6A–6C are components of the thermal management system incorporated into source 22. The approach is generally to have the entire source thermally stabilized at the lowest temperature desired for any of the temperature-controlled devices included in the source (generally including each of the lasers, along with the etalon plate).

Temperature control of the source is preferably accomplished at least in part by a large thermoelectric cooler 90, seen in FIGS. 6B, 6C, and 2B. Thermoelectric cooler 90 is in thermal contact with a suitably sized heat sink located external to source 22, for example, in the mounting rack in which a plurality of sources will be supported for use in a single transmitter.

Figure 10:
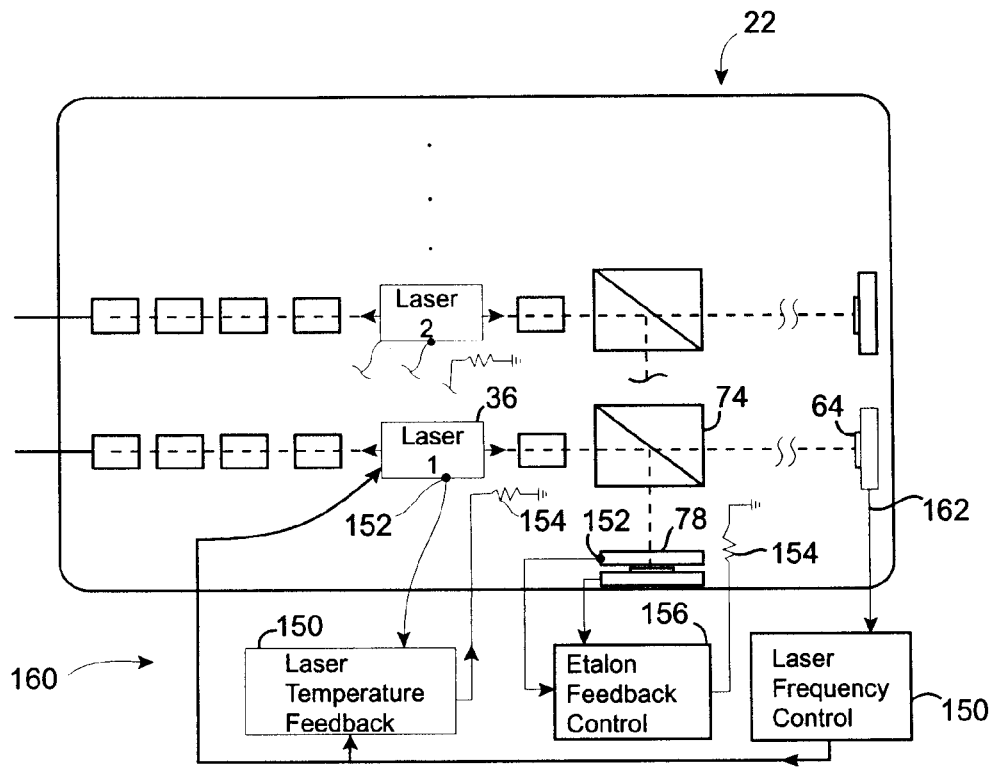
FIGS. 10 and 10A are simplified block diagrams schematically illustrating control loops included for a single channel of the fiberoptic source of FIGS. 2A and 2B.
Figure 10A:
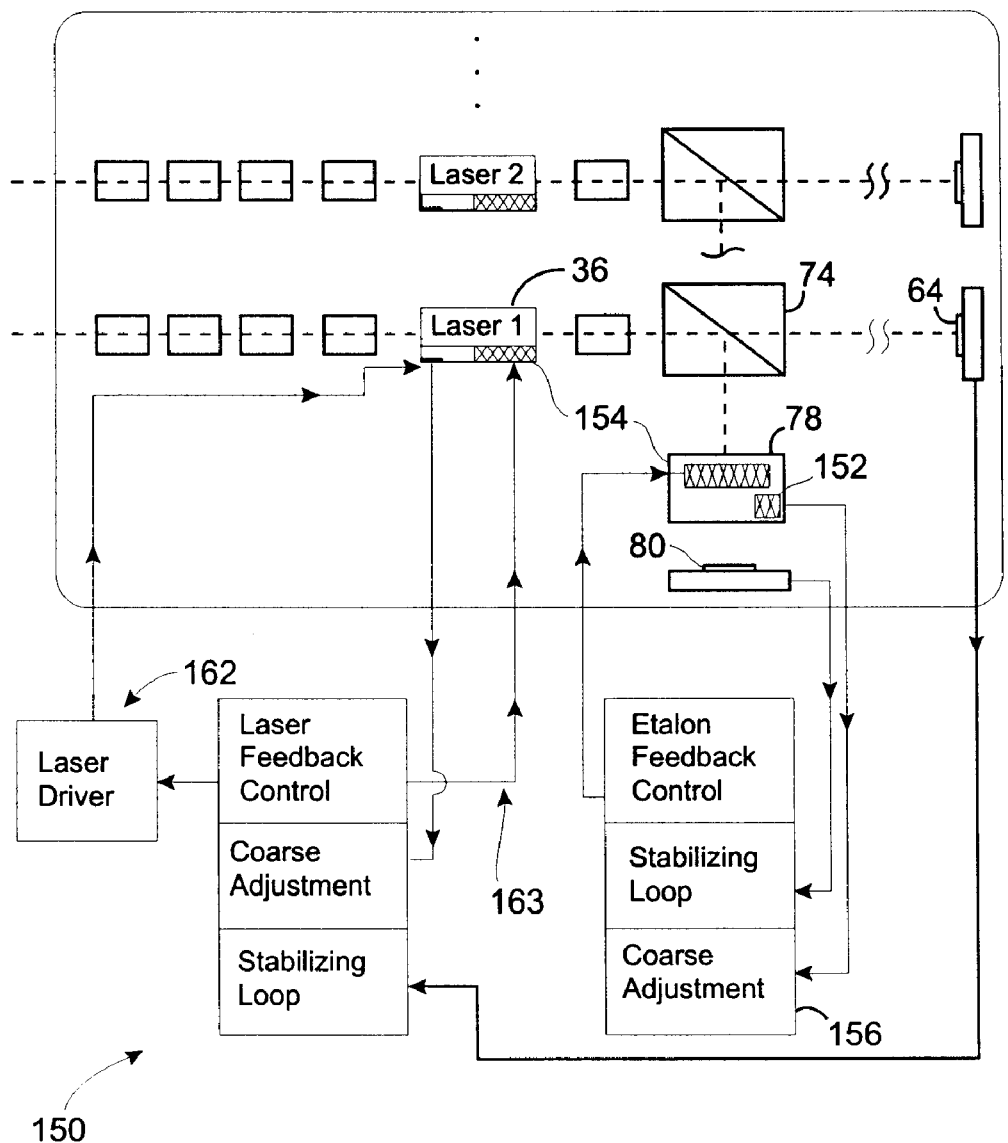

Each thermally controlled device on the source may have its own active thermal stabilization system. Specifically, a resistive (or other) microheater may be thermally coupled to each component, with a miniature thermistor (or other) temperature sensor thermally coupled for feedback control. Such temperature is primarily used for coarse control, with fine control effected by monitoring the light frequency of each device. The temperature sensor and heater function within an electronic control loop which actively controls the temperature, as illustrated in FIGS. 10 and 10A. Specifically, a laser feedback control system 150 makes use of input from a thermistor 152 for controlling heat applied by a heater 154.

Similarly, an etalon control system 156 may make use of an etalon thermistor 152 and heater 154 for feedback temperature control.

Figure 11:
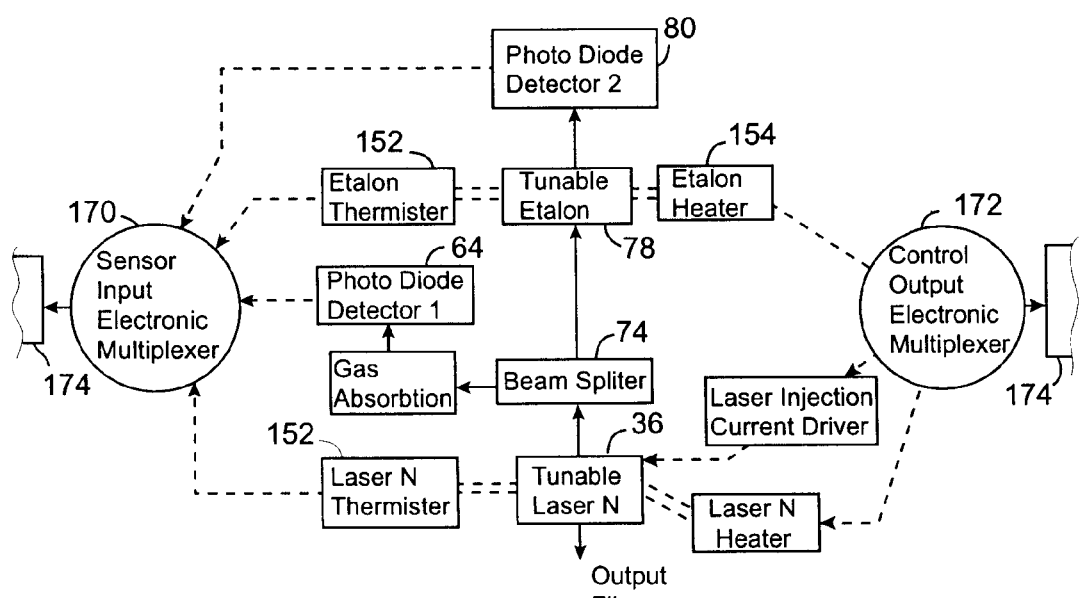
FIG. 11 is a more detailed block diagram schematically illustrating the multiplexed control loops, which may be included in the fiberoptic source of FIGS. 2A and 2B.

The electronic control system can be understood with reference to FIGS. 10, 10A, and 11. Two photodiodes are used as input sensors for each laser. One photodiode 64 is used to identify the reference frequency via gas absorption, and one photodiode 80 for alignment of the frequency of the laser with the etalon transmission grid. Hence, the electronic control circuit can adjust the laser frequency to any selected channel within a DWDM communication system. Advantageously, these circuits can actively maintain the laser output at the selected channel frequency, counteracting environmental variations and the like. Preferably, the control circuitry maintains a closed feedback control loop over the laser light frequency, and rapidly corrects any variations in frequency by adjusting, for example, injection current into laser 36 using a fast laser frequency control loop 162. Larger variations may be adjusted using the heater and thermistor 154, 152 via the laser temperature feedback control loop 163, for example, so as to provide the desired frequency adjustment range or select a particular channel within the reference grid. Alternative temperature sensors (such as thermocouples) and heat flow structures (such as dedicated TECs) might be employed.

For the etalon plate (or other frequency grid generator), the center (or other selected) frequency may be adjusted and stabilized by etalon feedback control 156 using the dedicated etalon heater thermally coupled to the etalon plate. A dedicated thermistor is used to bring the temperature of the etalon within the range desired (coarse tuning). The exact etalon temperature, corresponding to the exact position of each fringe is achieved by monitoring the transmission through the etalon for one or more particular reference frequency, optionally using light from one or more lasers tuned to a gas absorption line of the reference gas. Once again, for both the laser and etalon, the thermistor, heaters, and other thermal management components may be used to adjust the gross desired frequency range. Fine tuning and fast feedback-driving stabilization may be accomplished with reference to the photodiode outputs.

Figure 9:
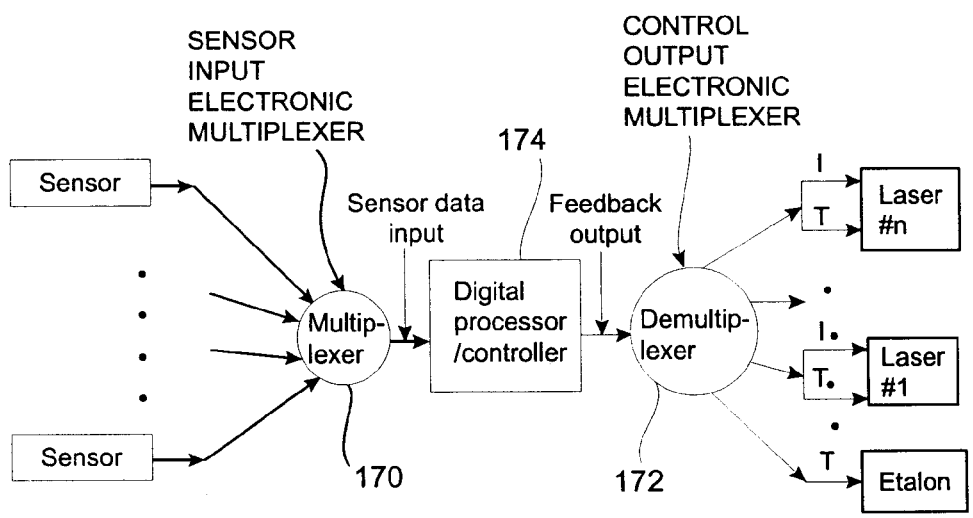
FIG. 9 is a simplified block diagram illustrating a multiplexed control arrangement for use with the fiberoptic source of FIGS. 2A and 2B.

As can be understood with reference to FIGS. 9 and 11, the electronic control system may be used to bring all lasers to their associated pre-determined frequency values, which will often comprise frequencies prescribed by the ITU frequency grid widely used for WDM fiberoptic communications. Analog control loops have traditionally been used for laser frequency stabilization using lock-in detection techniques, also referred to as phase-sensitive detection, synchronous detection, derivative detection, and the like. Such analog control loops may use the first (or any odd) derivative as detected in the amplitude modulation of the laser's output. Frequency selective elements such as either absorbing gas or an etalon can thereby be used to provide the above mentioned frequency discrimination which gives rise to detectable derivative signals. These detectable derivative signals can conveniently be used in the control loop as error signals, since they provide information on the position of laser frequency relative to the peak of the reference feature (absorption line, etalon fringe and the like).

As the multi-channel source of the present invention will control a relatively large number of individual devices (11 in the exemplary embodiment, with ten (10) laser and one etalon), it will often be advantageous to avoid the use of separate individual analog control loops for each device. Instead, an electronically multiplexed digital control system may be provided having a multiple sensor input multiplexer electronic 172 and a multiple control output electronic de-multiplexer 172 (both encompassed within the term "electronic multiplexer") coupling the components of source 22 with a digital processor/controller 174, typically via digital processor/controller input and output ports, respectively. In such a system, the single digital processor can control a plurality of devices (such as lasers 36 and/or etalon 78) using associated feedback control loops. This may be effected by multiplexing of both the input to and output from the digital processor. In effect, this allows a single digital control circuit to cycle sequentially through a number of input/output combinations, providing real-time and/or substantially continuous control so long as sufficient bandwidth and cycle speed are available.

For exemplary source 22, the cycle speed for each laser frequency controller will preferably be more than 1 Kilohertz, often being 3 Kilohertz or more with the thermal control feedback loops having a cycle speed of more that 1 Hertz, often being 3 Hertz or more. Such circuits, with bandwidths appropriate for the exemplary 10-laser, single etalon source 22 are well within the state of the art of digital electronics. A wide variety of commercial suppliers are capable of providing printed circuit boards with appropriate photodiodes for use in laser light source 22, including Sensors Unlimited, of Princeton, N.J. Optical board fabricators capable of fabricating optical microboards suitable for use as or within enclosure 30 may optionally take advantage of microelectromechanical structure ("MEMS") fabrication technologies to facilitate integration of the optical and other components of the source. Suitable optical motherboards may be fabricated by, for example, Coventor Inc., of Cary, N.C.; Flextronics International of San Jose, Calif.; and Axsun Technologies of Billerica, Mass.

An exemplary tunable laser diode structure 36 is illustrated in more detail in FIGS. 12A and 12B. Any tunable laser structure might be used, with tunable diode lasers being particularly advantageous. Suitable tunable lasers are commercially available from a number of suppliers. For example, the lasers may comprise Distributed Feedback Lasers (DFB), available from many manufacturers, including Agere, Fujitsu, JDS Uniphase, Uniphase, and Alcatel. Alternatively, Distributed Bragg Grating lasers (DBR) might be used, such as those available from Agility, Marconi, Alcatel, and Multiplex, Inc. Still further embodiments may employ Vertical Cavity Surface Emitting Lasers (VCSEL), such as those available from Nortel-Coretek and Bandwidth 9. Information on the embodiment illustrated in FIGS. 12A and 12B was published on the world wide web at http://www.marconicaswell.com/opto/tunlaser.htm, with reference to an SG-DBR Tunable Laser.

Figure 13:
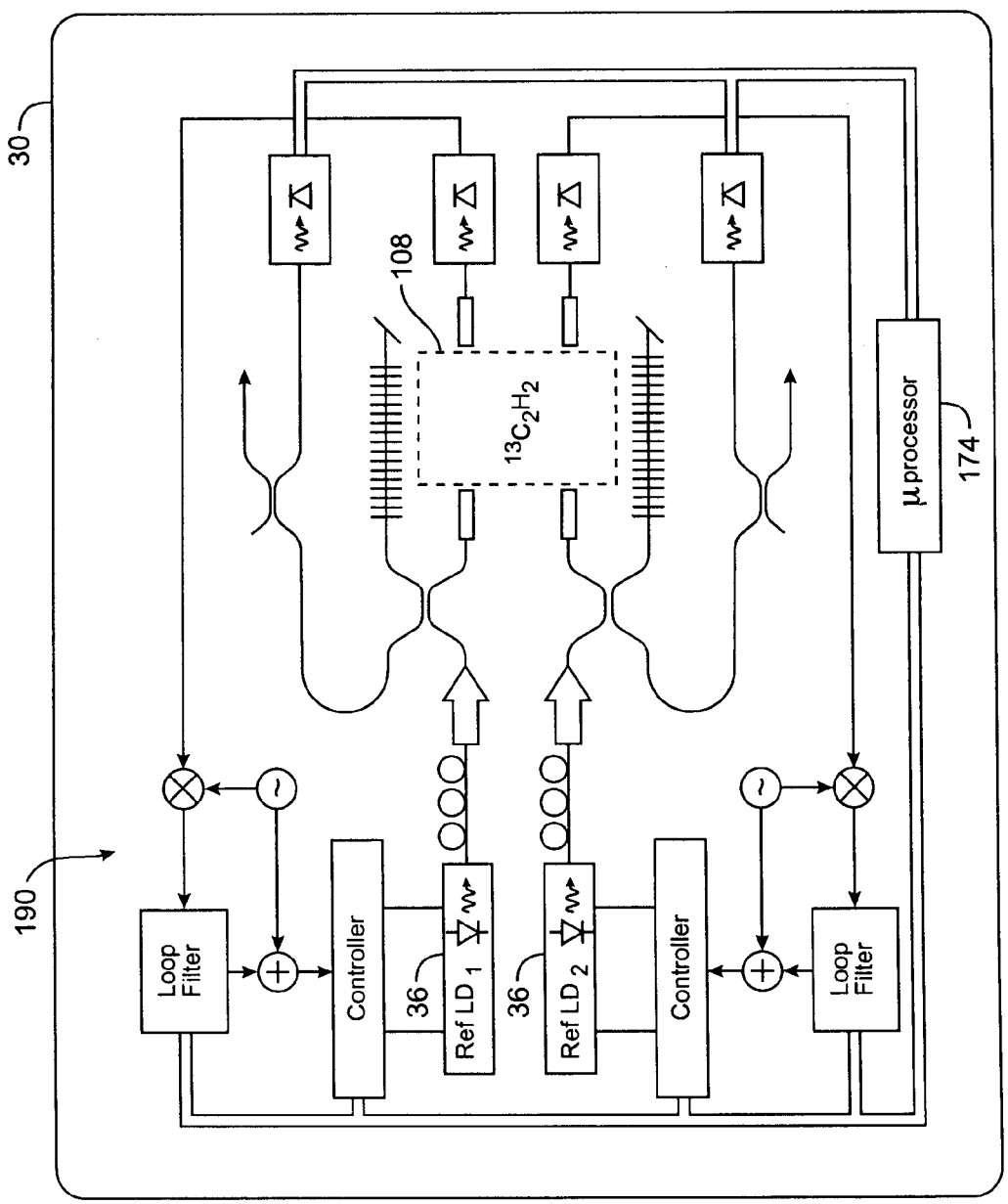
FIG. 13 schematically illustrates an alternative multi-channel laser and control arrangement which will benefit from aspects of the present invention.

Referring now to FIG. 13, an alternative structure which might make advantageous use of aspects of the present invention comprises a light generator 190 for generating a set of stabilized optical frequencies, as more fully described in U.S. Pat. No. 6,163,555 issued on Dec. 19, 2000. In generator 190, each of a set of output lasers is repetitively aligned with an associated one of a set of specifically determined frequencies by comparison of that emission frequency with a frequency indicated by an optical frequency meter. The optical frequency meter is repetitively re-calibrated by reference to the emission frequency of each of at least two frequency tunable calibration lasers emitting at respectively different frequencies. Each of the calibration lasers has its emission frequency continuously or repetitively aligned with the frequency of an associated spectral absorption line frequency standard, such as that provided by a reference gas cell 108. As can be understood with reference to the description of FIGS. 2A–3 above, practical fabrication of such a structure may be facilitated by utilizing a reference gas contained by an enclosure 30. Use of a reference gas disposed within enclosure 30 is particularly advantageous for miniaturization of structure 190, particularly when combined with reflecting elements so as to provide a folded optical path through the reference gas as described above.

In light of the above, an optical light source for use in wavelength division multiplexed and dense wavelength division multiplexed systems may include a reference gas contained by a hermetically sealed enclosure which also protects one or more light generating structures. A frequency comb or grid generator, typically in the form of an optical etalon or the like, can be frequency referenced to an absolute reference point provided by the reference gas. Wavelength modulation at low modulation frequencies can provide error signals to the controller circuitry, which may establish a coincidence between the laser frequency and the peak of a referencing spectral feature such as a gas absorption line, an etalon fringe, or the like. Active control of a laser's frequency can be achieved by using an electronic feedback control system acting upon the laser's injection current in order to keep the laser frequency coincident with that of the referencing structure (frequency locking). An active, feedback based, thermal management systems can provide control of the frequency range of operation of each light generating laser, and can also bring the etalon to or near its desired operating point. Electronic control over a number of separate lasers (and the grid) may be effected using a multiplexed digital controller.

While the exemplary embodiments have been described in some detail, by way of example and for clarity of understanding, a variety modifications, adaptations, and changes will be obvious to those of skill in the art. For example, a reference frequency may be imposed on light generated by fiber lasers, solid state lasers (ion in a crystal matrix, not semiconductor), gas lasers and the like, by containing both the diode and the reference gas within a sealed enclosure. In some embodiments, some or all of the components of the fiberoptic source may be fabricated as an integrated optical and/or opto-electrical assembly by selectively modifying a substrate using techniques analogous to those developed for fabrication of integrated circuits. Hence, the scope of the present invention is limited solely by the appended claims.

What is claimed is:

1. A light generation structure comprising:
   a sealed enclosure;
   a light source disposed within the enclosure;
   a waveguide having an entrance disposed within the enclosure in an optical path from the light source;
   a reference gas contained by the enclosure, the reference gas imposing a reference characteristic on light from the light source, wherein the enclosure inhibits leakage of the reference gas;
   a frequency-adjustable etalon in another optical path from the light source, the etalon generating interference fringes at a plurality of discretely separated frequencies; and
   an etalon feedback control loop coupled to the etalon to stabilize the discretely separated frequencies of the etalon in response to the reference characteristic.

2. The structure of claim 1, wherein the reference characteristic comprises a reference wavelength, the reference gas absorbing light energy at the reference wavelength.

3. The structure of claim 2, wherein the light source comprises a frequency adjustable laser, and further comprising feedback control circuitry coupling the light with the reference characteristic to the frequency adjustable laser so as to frequency stabilize the frequency adjustable laser in response to the reference wavelength.

4. The structure of claim 1, wherein the light source comprises at least two lasers, wherein the reference gas imposes the reference characteristic upon light traveling from each laser.

5. The structure of claim 4, wherein the waveguide comprises at least two optical fibers, wherein each optical fiber extends to an optical fiber end disposed outside the enclosure and wherein the at least two optical fibers are associated with the at least two lasers for transmission of light therefrom out of the enclosure.

6. The structure of claim 1, wherein the enclosure has an enclosure length, wherein a length of the light beam through the reference gas is greater than the enclosure length, the light beam reflected by at least one reflecting element.

7. The structure of claim 6, further comprising an additional laser within the enclosure transmitting light along an additional light beam the additional light beam being separated from the light beam and reflected by the at least one reflecting element, the at least one reflecting element folding both of the separated light beams within the enclosure.

8. An optical fiber source comprising:
   a sealed enclosure;
   a first variable-frequency laser disposed within the enclosure;
   an optical fiber having an entrance disposed within the enclosure in an optical path from the laser, the fiber extending out from the enclosure;
   a reference gas contained by the enclosure, the reference gas imposing a reference frequency on light from the laser, wherein the enclosure inhibits leakage of the reference gas;
   feedback control circuitry comprising light sensors coupling the light with the reference frequency to the laser so as to control a frequency of the light in response to the reference frequency;
   a plurality of additional frequency adjustable lasers producing additional light signals having signal frequencies, wherein the signal frequencies are adjusted in response to the reference frequency;
   a frequency-adjustable etalon in another optical path from at least one of the lasers, the etalon generating interference fringes at a plurality of discretely separated frequencies;
   an etalon feedback control loop coupled to the etalon to stabilize the discretely separated frequencies of the etalon in response to the reference frequency; and
   the feedback control circuitry including a plurality of control loops coupled to the additional lasers for adjusting of the signal frequencies in response to the discretely separated frequencies of the etalon.

9. The optical fiber source of claim 8, wherein the feedback loops of the control circuitry comprise multiplexed feedback control loops so as to provide sequential adjustment of the etalon, the additional lasers, and the first laser.

10. The optical fiber source of claim 8, wherein the first laser comprises a laser cavity having first and second ends, wherein the first end of the laser cavity is adjacent the optical path from the first laser to the entrance of the optical fiber, and wherein the light with the reference gas is refracted from the second end of the laser cavity.

11. An optical fiber source comprising:

an enclosure;

a plurality of lasers disposed within the enclosure, each laser having a cavity with a first end and a second end;

a plurality of optical fiber entrances, each entrance in a first optical path from an associated laser adjacent the first end of the cavity;

a reference gas contained by the enclosure, the reference gas imposing a reference characteristic on light from an associated laser, wherein the enclosure inhibits leakage of the reference gas;

a plurality of light sensors, each light sensor disposed in a second optical path from an associated laser;

a controller coupling the light sensors to the lasers so as to effect independent feedback control over light generated by the lasers;

at least one beamsplitter disposed in the second optical path between the lasers and the light sensors;

a etalon disposed in a third optical path from the beamsplitter, the etalon coupled to the controller for maintaining separation between frequencies of light from the lasers by stabilizing each laser to the top of a selected etalon fringe.

12. The source of claim 11, further comprising a plurality of reflecting elements, wherein the lasers are disposed substantially between a first set and a second set of the reflecting elements so that at least one of the first optical paths and the second optical paths within the enclosure are longer than the enclosure.

13. The source of claim 12, wherein the reflecting elements comprise prisms disposed along the second reference paths.

14. The source of claim 11, further comprising a substrate supporting the light sensors and defining a plane, at least one of the first optical paths and the second optical paths traversing through the substrate at a significant angle to the plane.

15. The source of claim 11, wherein the second optical path extends from the second end of the cavity.

16. The source of claim 11, wherein the enclosure comprises an assembly having an inner surface for receiving and positioning a plurality of optical components along at least one of the first optical paths and the second optical paths.

17. The source of claim 16, wherein the optical fiber entrances comprise fiber ends, and wherein the inner surface comprises features aligning isolator components, a collimating lens, and a fiber end with each first optical path.

* * * * *